(12) United States Patent
Tai

(10) Patent No.: US 6,507,245 B2
(45) Date of Patent: Jan. 14, 2003

(54) AMPLIFIER THAT IS DRIVEN IN A COMPLEMENTARY MANNER

(75) Inventor: Jy-Der David Tai, Phoenix, AZ (US)

(73) Assignee: AMIC Technology (Taiwan) Inc., Hsin-Chu Hsien (TW)

(*) Notice: Subject to any disclaimer, the term of this patent is extended or adjusted under 35 U.S.C. 154(b) by 0 days.

(21) Appl. No.: 10/063,126

(22) Filed: Mar. 25, 2002

(65) Prior Publication Data

US 2002/0145471 A1 Oct. 10, 2002

(30) Foreign Application Priority Data

Apr. 4, 2001 (TW) ......................................... 90108198 A

(51) Int. Cl.[7] .............................................. G01R 19/00
(52) U.S. Cl. ....................................................... 330/255
(58) Field of Search .............................. 330/255, 264, 330/265

(56) References Cited

U.S. PATENT DOCUMENTS 4,296,382 A * 10/1981 Hoover ........................ 330/264
5,166,635 A * 11/1992 Shih ............................ 330/253
5,455,524 A * 10/1995 Ikeya et al. .................... 326/47
6,184,750 B1 * 2/2001 Somerville .................. 330/255

* cited by examiner

Primary Examiner—Patricia Nguyen
(74) Attorney, Agent, or Firm—Winston Hsu

(57) ABSTRACT

An amplifier includes a push-up circuit and a pull-down circuit. The push-up circuit includes a first differential pair and a first driving circuit. The first driving circuit is connected to the first differential pair in a cascade manner. The first driving circuit has a common source amplifying circuit formed of a MOS (metal-oxide-semiconductor). The pull-down circuit includes a second differential pair and a second driving circuit. The second driving circuit is connected to the second differential pair in a cascade manner. The second driving circuit has a common source amplifying circuit formed of a MOS. A portion of a normal operation voltage range of the push-up circuit overlaps a portion of a normal operation voltage range of the pull-down circuit.

9 Claims, 3 Drawing Sheets

AMPLIFIER THAT IS DRIVEN IN A COMPLEMENTARY MANNER

BACKGROUND OF THE INVENTION

1. Field of the Invention

The present invention relates to an amplifying circuit of an amplifier, and more particularly, to an amplifier which is driven in a complementary manner using a common source amplifying circuit to extend the input and output signal voltage range.

2. Description of the Prior Art

The rapid growth of technology has insured that electronic signals will remain an important medium for transmitting data. Signals are used to control various servers, mechanical devices, and electrical apparatus. They allow people to control many fast and labor-saving machines, adding convenience to modern life. Of course, electronic signals are also an indispensable medium for data transmission. Things we often take for granted, such as mobile phones, radio, television, and satellite communications, all rely on electronic signals.

Good circuit design is indispensable for processing these electronic signals and amplifiers are often foundation blocks for circuits. Base functions of an amplifier are to amplify or magnify the signal, and to provide buffering and driving capability. Although the electric driving ability (including current and/or voltage) of the electronic signal is not large, the amplifier can be driven and also generate output signals which have a larger electric driving ability, or current strength, and maintain the same waveform as the input signals.

Please refer to FIG. 1. FIG. 1 is a functional block diagram of a prior art amplifier 10. The amplifier 10 comprises an input circuit 12, an output circuit 14, and a unit-gain buffer circuit 18 connected between the input circuit 12 and the output circuit 14. The input circuit 12 is used to receive signals transmitted from an external circuit (not shown in FIG. 1). After the signals have passed through the input circuit 12, the signals travel to an input end of the unit-gain buffer circuit 18. The input end is connected to a node A. The unit-gain buffer circuit 18 will not amplify voltage amplitude of the signals (so it is unit-gain), but it can provide an input signal buffer and increase the strength of the current. That means, although the current driving ability of the signals transmitted into the unit-gain buffer circuit 18 is not large, the unit-gain buffer circuit 18 can be driven and also generate output signals which have a larger current while having the same voltage amplitude as the input signals. The output signals transmit to the output circuit 14 through a node B. The output circuit 14 can further amplify the signals, and provide good output impedance.

A typical unit-gain buffer circuit is composed of an operational amplifier and a suitable negative feedback circuit. The unit-gain buffer circuit 18 shown in FIG. 1 uses the operational amplifier 16 to be a main portion of the unit-gain buffer circuit 18. The operational amplifier 16 has two differential input ends; one of the input ends is connected to node A, and another input end is connected to an output end of the operational amplifier in node B through an electrical path 19, forming the negative feedback circuit.

In theory, the voltage waveform of the signals on node B (the output end of the unit-gain buffer circuit 18) is the same as the voltage waveform of the signals on node A (the input end of the unit-gain buffer circuit 18), achieving a result of unit-gain. The functional relationship between the input signal voltage and the output signal voltage in an ideal unit-gain buffer circuit is perfectly linear. However, this is not possible in the real world. Because the operational amplifier has certain output voltage swing limitations, the output signal voltage of the unit-gain buffer circuit also has certain voltage swing limitations. Particularly, when the input signal voltage of the unit-gain buffer circuit becomes small (near zero voltage), because of the lower limit of the voltage range of the output signal, the output signal voltage of the unit-gain buffer circuit is unable to follow the low input signal voltage. Therefore, the error between the output signal voltage and the input signal voltage will increase, and the unit-gain buffer circuit cannot achieve the function of unit-gain. Similarly, when the input signal voltage of the unit-gain buffer circuit becomes large, near current bias of the amplifier, because of the upper limit of the voltage range of the output signal, the output signal voltage of the unit-gain buffer circuit is also unable to follow the input signal voltage. Therefore, the unit-gain buffer circuit cannot achieve the ideal unit-gain standard.

For a further description of the limitations of the output signal voltage range of an actual unit-gain buffer circuit, please refer to FIG. 2. FIG. 2 is a perspective view of an amplifying circuit 20 according to a prior art. Besides a typical input circuit 22 and an output circuit 24, the amplifying circuit 20 uses a gain circuit 26 to be the unit-gain buffer circuit. VDD is used for biasing the gain circuit 26. The gain circuit 26 comprises a first differential pair 28, a second differential pair 30, a first driving circuit 32 and a second driving circuit 34. Two differential ends of the first differential pair 28 are connected to nodes NN1 and NN2. Two differential ends of the second differential pair 30 are also connected to nodes NN1 and NN2. The first differential pair 28 is connected to the first driving circuit 32 on nodes NN4 and NN5 in a cascade manner. The second differential pair 30 is also connected to the second driving circuit 34 on nodes NN6 and NN7 in a cascade manner. The first driving circuit 32 is connected to the second driving circuit 34 on nodes NN8 and NN3. Node NN3 is used as an output end of the gain circuit 26. Nodes NN1 and NN2 are used as two differential input ends of the operational amplifier. Node NN1 is an input end of the gain circuit 26. Node NN2 is connected to node NN3 through path 29, forming a negative feedback circuit and making the gain circuit 26 a unit-gain buffer circuit.

In the gain circuit 26, the first differential pair 28 comprises two n-type MOS (metal-oxide semiconductor) transistors M1 and M2. The first differential pair 28 is biased by current source Iss1. The second differential pair 30 comprises two p-type MOS transistors MP1 and MP2. The second differential pair 30 is biased by current source Iss2. Two output ends of the first differential pair 28 are connected to nodes NN4 and NN5, and use transistors M9 and M10 to be active load. Gates of transistors M9 and M10 use direct current voltage Vg4 to bias. The transistors M9 and M10 are used as a current source. Gates of the two transistors M3 and M4 in the first driving circuit 32 use direct current voltage Vg3 to bias, making the transistors M3 and M4 function as a common-gate amplifier. Similarly, in the second driving circuit 34, the transistors M5 and M6, biased by direct current voltage Vg2, are also used as a common-gate amplifier. The transistors M7 and M8 form a current mirror for biasing and to be active load.

The operation of the prior art gain circuit 26 can be described as follows. The nodes NN1 and NN2 can be treated as two differential input ends of the first differential pair 28 and the second differential pair 30. The signals inputted into the two differential input ends of the first differential pair 28 will output to the active load M9 and M10 through nodes NN4 and NN5, and be amplified by transistors M3 and M4 that are common-gate amplifiers. Then the signals will be outputted to nodes NN8 and NN3. On the other side, the signals inputted into the two differential input ends of the second differential pair 30 will be outputted to nodes NN6 and NN7. The transistors M7 and M8 that form the current mirror, can couple the signals (including the contribution of the transistors M3 and M5 of the common-gate amplifier) on node NN8 to node NN7 through the transistor M8, by way of the common-gate amplifier of the transistor M6. The dual end signals inputted to nodes NN1 and NN2 can be changed to one end output on node NN3. The electricity path 29 between node NN2 (one of the differential input ends) and node NN3 (the output end of the gain circuit 26) forms a negative feedback circuit, making the prior art gain circuit 26 a unit-gain buffer circuit.

The drawback of the gain circuit 26 in the prior art amplifier 20 is that the common-gate amplifiers (that are transistors M3, M4, M7 and M8) are connected in a cascade manner. This design increases the limitations on the input signal voltage on node NN3, causing the output signal voltage range on node NN3 to become correspondingly smaller. The output signal voltage is unable to go down to near zero voltage and unable to rise up to near VDD voltage. Because the common-gate amplifiers of the prior art gain circuit 26 are connected in a cascade manner, the lower limit of the output signal voltage range on node NN3 of the prior art gain circuit 26 will be affected by voltage across the transistors M6 and M8 (voltage between source-drain of the transistors M6 and M8). If the voltage across the transistors M6 and M8 is too small, the operation point of the transistors M6 and M8 will be driven into triode region, making the transistors M6 and M8 unable to operate normally. To maintain the normal operation voltage across the transistors M6 and M8, the lower limit of the output signal voltage range on node NN3 cannot be near zero voltage (voltage of ground). Similarly, because the common-gate amplifier (transistor M4) of the first driving circuit 32 is connected in a cascade manner, the upper limit of the output signal voltage range on node NN3 will be affected by normal voltage across the transistors M4 and M10. If the voltage (voltage between source-drain of the transistors M4 and M10) across the transistors M4 and M10 is too small, the operation point of the transistors M4 and M10 will be driven into triode region, making transistors M4 and M10 unable to operate normally. To make the transistors M4 and M10 operate normally, the upper limit of the output signal voltage range on node NN3 cannot be near the direct current voltage VDD. The reasons mentioned above make the output signal voltage range on node NN3 in the prior art gain circuit 26 unable to fully extend from zero voltage to VDD. If an input signal voltage to node NN1 of the gain circuit 26 (which is used as a unit-gain buffer circuit) is too small (near zero voltage) or too large (near VDD), the output signal voltage of the gain circuit 26 is unable to follow the input signal voltage correctly because of the limitations of the output signal voltage range on node NN3. Therefore, there is a non-linear functional relationship between the input and output signal, making the prior art amplifier 20 unable to operate normally.

In order to increase the usefulness of integrated circuits, decrease power consumption, and avoid complex circuit designs and non-desirable effects of semiconductor elements, today's circuits use positive direct current voltage (such as the direct current voltage VDD mentioned above) to bias. It is better if the voltage of the direct current is smaller. Therefore, the normal operation range of the amplifier is stricter. It is good if the input and output signal voltage range of the amplifier can be extended fully from zero to direct current voltage VDD and the amplifier operates normally in that range. One of the functions of the unit-gain buffer circuit is to make the output signal voltage follow the input signal voltage (unit-gain). One method of measuring the operation of the unit-gain buffer circuit is to measure the error between the input and output signal voltage. If the input signal voltage is as low as 0.3 volts, the designer of the unit-gain buffer circuit hopes that the error between the input and output signal voltage is less than several ten microvolts. Similarly, if the input signal voltage is between VDD and 0.3 volts (meaning the input signal is within 0.3 volts of the VDD), the designer hopes that the error between the input and output signal voltage is less than several ten microvolts. However, because the common-gate amplifiers of the gain circuit 26 (which is treated as the unit-gain buffer circuit) shown in FIG. 2 are connected in a cascade manner, when the input signal voltage is less than 0.3 volts or greater than VDD-0.3 volts, the error between the input and output signal voltage is greater than one hundred microvolts. This great error is a serious limitation of gain circuit 26.

SUMMARY OF INVENTION

It is therefore a primary objective of the claimed invention to provide an amplifier that is driven in a complementary manner, using a common source amplifying circuit to extend the input and output signal voltage range.

The amplifier according to the claimed invention includes a push-up circuit and a pull-down circuit. The push-up circuit includes a first differential pair and a first driving circuit. The first driving circuit is connected to the first differential pair in a cascading manner. The first driving circuit has a common source amplifying circuit formed of a MOS (metal-oxide-semiconductor). The pull-down circuit includes a second differential pair and a second driving circuit. The second driving circuit is connected to the second differential pair in a cascading manner. The second driving circuit has a common source amplifying circuit formed of a MOS. A portion of a normal operation voltage range of the push-up circuit overlaps a portion of a normal operation voltage range of the pull-down circuit. A remaining portion of the normal operation voltage range of the push-up circuit falls outside the normal operation voltage range of the pull-down circuit. A remaining portion of the normal operation voltage range of the pull-down circuit falls outside the normal operation voltage range of the push-up circuit.

It is an advantage of the claimed invention that the first and second driving circuit is connected to the first and second differential pair in a cascading manner. Therefore, although the input signal voltage is extremely small or extremely large, the output signal voltage can follow the input signal voltage, effectively improving on the non-linear phenomenon in the prior art.

These and other objectives of the claimed invention will be apparent to those of ordinary skill in the art after reading the following detailed description of the preferred embodiment, which is illustrated in the various figures and drawings. dr

DETAILED DESCRIPTION

Figure 3:
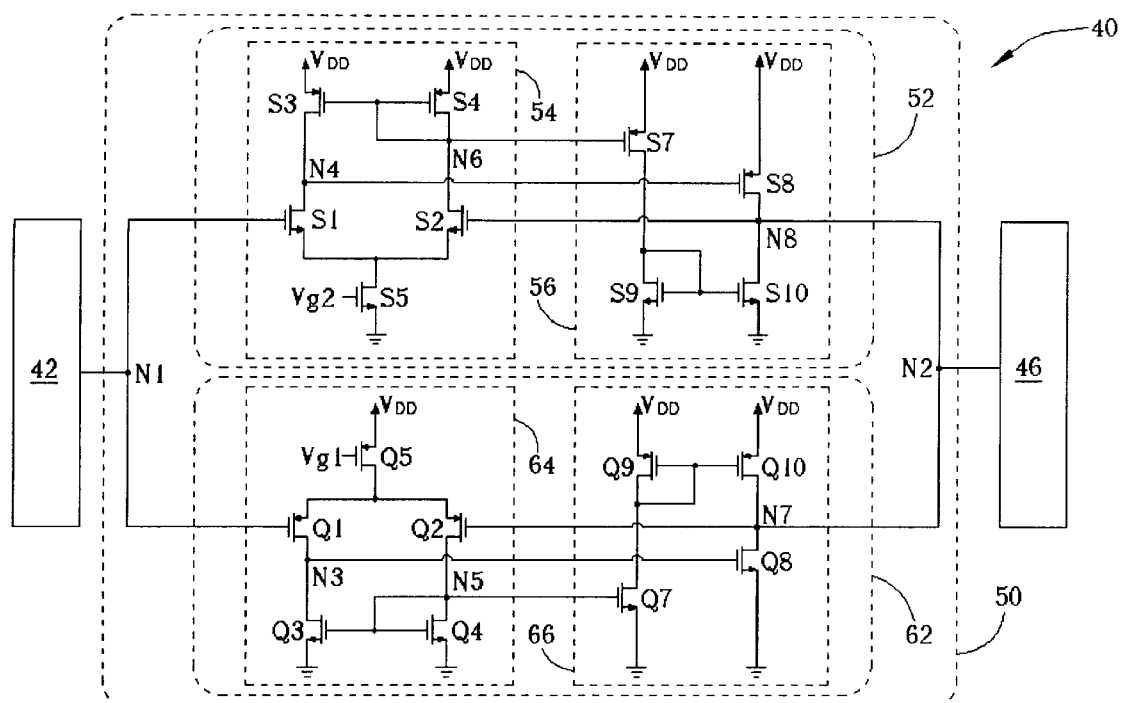
FIG. 3 is a circuit structural diagram of an amplifier according to the present invention.

Please refer to FIG. 3. FIG. 3 is a circuit structural diagram of an amplifier 40 according to the present invention. The amplifier 40 comprises an input circuit 42, an output circuit 46, and a gain circuit 50 connected between the input circuit 42 and the output circuit 46. The input circuit 42 is used to receive the input signals transmitted into the amplifier 40, and then transmits the input signal to the gain circuit 50 through node N1. The gain circuit 50 is a unit-gain buffer circuit that is used to output the output signals to node N2. The output signals have a large current driving ability, and a waveform of the output signal voltage can follow a waveform of the input signal voltage on node N1. The driving ability (includes current or/and voltage) of the signals outputted from node N2 of the gain circuit 50 are further increased when the signals are transmitted to the output circuit 46. The increased signals are output signals of the amplifier 40. The output circuit 46 provides good output characteristics (such as output resistance) for amplifier 40.

In order to extend the effective operating range of the present invention amplifier 40, the gain circuit 50 has a unique design. As shown in FIG. 3, the present invention gain circuit 50 comprises a push-up circuit 52 and a pull-down circuit 62. The push-up circuit 52 comprises a first differential pair 54 and a first driving circuit 56. The pull-down circuit 62 comprises a second differential pair 64 and a second driving circuit 66. The gain circuit 50 uses a positive direct current voltage VDD to bias. In the first differential pair 54, the gates of n-type transistors S1 and S2 have formed dual input ends of the first differential pair 54. Transistors S3 and S4, which are treated as a first current mirror, are the active load of the first differential pair 54. A gate of transistor S5 uses direct current voltage Vg2 to bias. The transistor S5 provides current source to the first differential pair 54 for biasing. The dual output ends of the first differential pair 54 are connected to the first driving circuit 56 on nodes N4 and N6 in a cascading manner. Transistors S7 and S8 of the first driving circuit 56 are used as common source amplifying circuits. The common source amplifying circuits can amplify signals transmitted to gates of the transistors S7 and S8 to reach both drain voltages. A second current mirror formed by transistors S9 and S10 is connected to the transistors S7 and S8. The second current mirror not only provides current to the transistors S7 and S8 for biasing, but also acts as active load of the common source amplifying circuit (transistors S7 and S8). The coupling of the second current mirror results in the dual end signals transmitted from the first differential pair 54 to the first driving circuit 56 being converted to a single end signal to node N8 of the first driving circuit 56. Similarly, the second differential pair 64 of the pull-up circuit 62 uses gates of p-type transistors Q1 and Q2 to be dual input ends of the second differential pair 64. Transistor Q5 uses direct current voltage Vg1 to bias and provides current to the second differential pair 64 for biasing. Transistors Q3 and Q4 form a third current mirror that acts as the active load of the second differential pair 64. The dual output ends of the second differential pair 64 are connected to the second driving circuit 66 (through nodes N4 and N6) in a cascading manner through nodes N3 and N5. Transistors Q7 and Q8 of the second driving circuit 66 are used to make a common source amplifying circuit. The common source amplifying circuit amplifies signals (which are transmitted from the second differential circuit 64) to an active load that is a fourth current mirror formed by transistors Q9 and Q10. The fourth current mirror can couple the dual end signals of transistors Q7 and Q8 and send a single output to node N7.

In order to be a unit-gain buffer circuit, the input end of the gain circuit 50 is connected to one of the differential input ends of the first differential pair 54 on N1, and connected to one of the input ends of the second differential pair 64. Node N8 of the first driving circuit 52 is connected to another differential input end of the first differential pair 54, forming the negative feedback circuit in push-up circuit 52. Similarly, in pull-down circuit 62, another differential input end of the second differential pair 64 is also connected to node N7 in the second driving circuit 66, forming the negative feedback circuit. Node N8 (output end of the first driving circuit 56) is connected to node N7 (output end of the second driving circuit 66) on node N2 that is the final output end of the whole gain circuit 50. The signals outputted from node N2 continuously transmit to the output circuit 46 of the amplifier 50.

As mentioned before, the ideal unit-gain buffer circuit has a wider effective operation range so that even when the input signal voltage is near zero or near the direct current voltage VDD, the output signal voltage can follow the input signal voltage correctly. In order to achieve this design target, the present invention gain circuit 50 uses the push-up circuit 52 and the pull-down circuit 62. When the input signal voltage inputted to the gain circuit 50 on node N1 is near the direct current voltage VDD, the operation point of the p-type transistor Q5 inside the pull-down circuit 62 will enter the triode region, breaking away from the normal operation region and is unable to operate normally. The transistors Q1, Q2 and Q3 will be turned off because the voltage of node N1 is too near VDD resulting in pull-down circuit 62 being unable to operate normally. However, the n-type transistors S1, S2 and S5 in the push-up circuit 52 are biasing in the normal operation region. Although the input signal voltage to node N1 is near the direct current voltage, push-up circuit 52 still can operate normally, using the negative feedback circuit in the push-up circuit 52 to make the gain circuit 50 into a unit-gain buffer circuit.

When the input signal voltage on node N1 is near zero, the operation point of n-type transistor S5 in the push-up circuit 52 will near the edge of its normal operational range. Transistors S1, S2, and S5 may be turned off, making the push-up circuit 52 unable to operate normally. However, the pull-down circuit 62 can still operate normally inside its normal operational range at this time using the negative feedback circuit inside the pull-down circuit 62 to make the gain circuit 50 into a unit-gain buffer circuit.

Therefore, although the pull-down circuit 62 is unable to operate normally when the input signal voltage to node N1 is too large (near VDD), and push-up circuit 52 is unable to operate normally when the input signal voltage to node N1 is too small (near zero), either push-up circuit 52 or pull-down circuit 62 can operate normally in extreme situations. Relying on the complementary operations of the push-up circuit 52 and the pull-down circuit 62, the present invention gain circuit 50 can function as a unit-gain buffer circuit even when the input signal voltage to node N1 is too large or too small. Of course, when the input signal voltage to N1 is between the maximum and the minimum, the push-up circuit 52 and the pull-down circuit 62 can both operate normally and the present invention gain circuit 50 can also operate normally.

Figure 1:
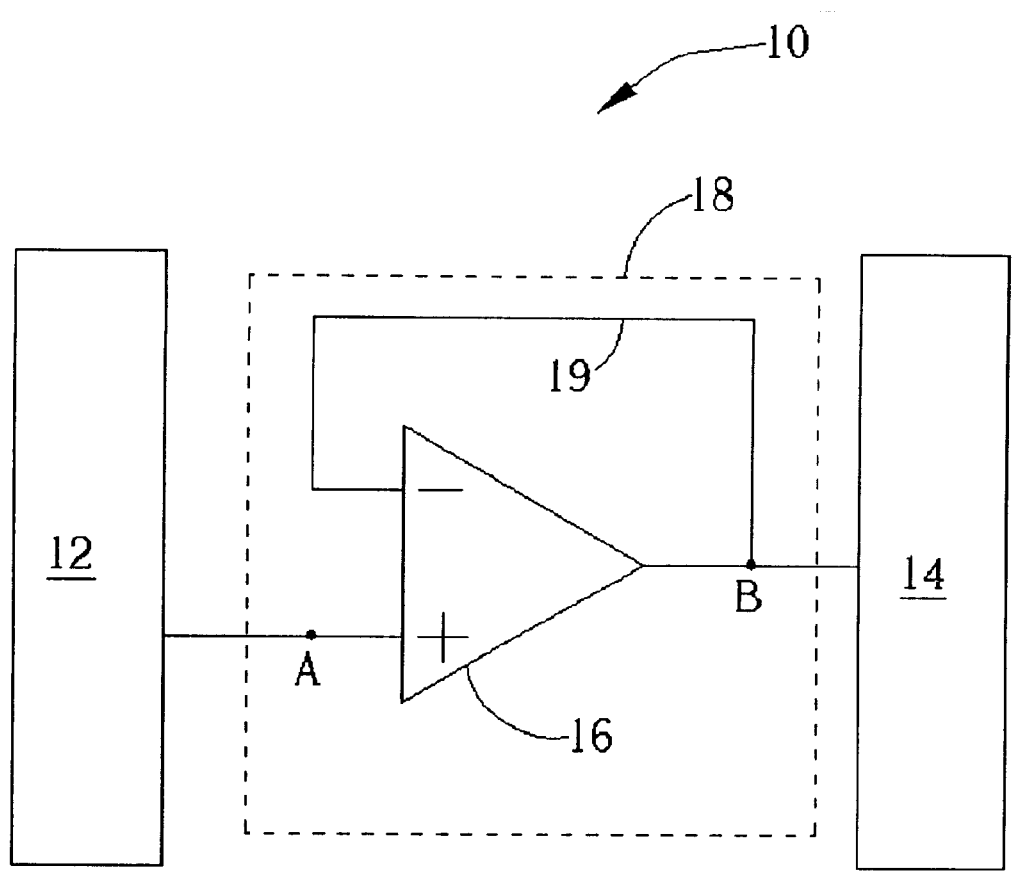
FIG. 1 is a functional block diagram of an amplifier according to a prior art.
Figure 2:
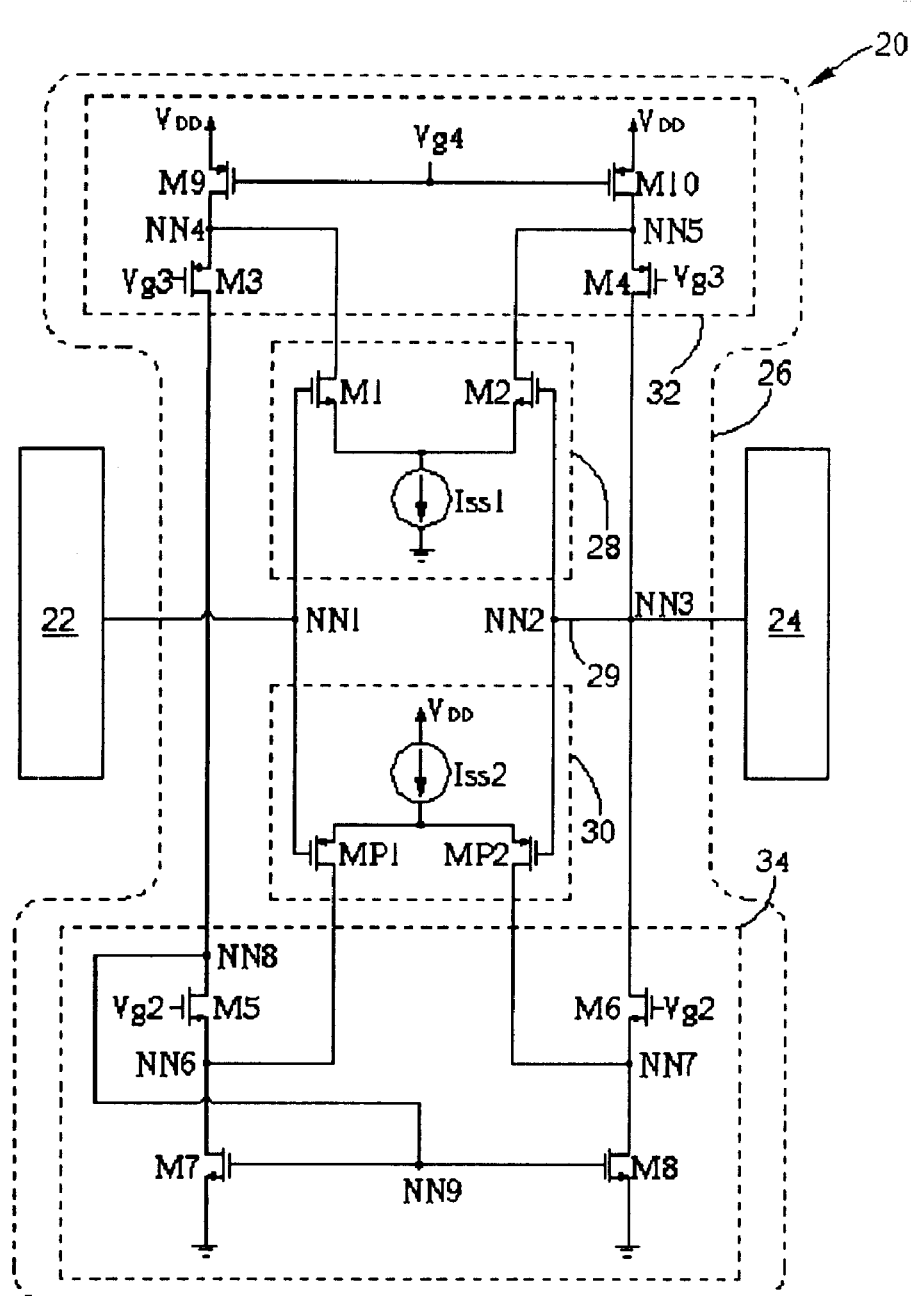
FIG. 2 is a perspective view of an amplifying circuit according to a prior art.

Using the complementary driving design mentioned above can effectively extend the normal input signal voltage range of gain circuit 50. The present invention circuit 50 can also extend the output signal voltage range by using the common source amplifying circuits connected in a cascade manner. In the ideal unit-gain buffer circuit, the output signal voltage must be able to follow the input signal voltage. In the present invention gain circuit 50, the push-up circuit 52 can operate normally when the input signal voltage to node N1 is near VDD, so the output signal voltage of the gain circuit 50 is decided by the voltage on node N8 in the first driving circuit 56. The signals of the first differential pair 54 in the push-up circuit 52 are transmitted to the transistors S7 and S8 (which is regarded as a common source amplifying circuit) in the first driving circuit 56 in cascade manner. Only the voltage across transistor S8 (the voltage between source-drain of the transistor S8), which is turned on in a low current situation, affects the voltage between node N8 and the direct current voltage VDD. Although the voltage across transistor S8 is very small, transistor S8 will not enter the triode region and make the transistor S8 unable to operate normally. Because decreasing the voltage across the transistor S8 will not affect the normal operation of the transistor S8, the voltage on node N8 can tend to the direct current voltage VDD, achieving the purpose of extending the output signal voltage range of the gain circuit 50. This improves the prior art gain circuit 26 shown in FIG. 2. In the prior art gain circuit 26, because the common gate amplifiers are connected in cascade manner, the upper limit of the output signal voltage is affected by the voltage across the two transistors M4 and M10. The output signal voltage on node NN3 is unable to tend to the direct current voltage VDD, affecting the function of the prior art gain circuit.

Similarly, in FIG. 3, the pull-down circuit 62 of the gain circuit 50 can operate normally when the input signal voltage on node N1 is near zero voltage. The voltage on node N7 of circuit 66 decides the output signal voltage of circuit 50 on node N2. Because the gain circuit 50 is connected to transistor Q8 (which is treated as the common source amplifying circuit) in cascade manner, only the voltage across the transistor Q8 affects the voltage between node N7 and the ground. Therefore, when the input voltage on node N1 is very small, transistor Q8 is turned on in a low current situation. Although the voltage across transistor Q8 is very small, the operation point of transistor Q8 will not enter into the triode region and make transistor Q8 unable to operate normally. Therefore, the lower limit of the output signal voltage of the present invention gain circuit 50 can effectively tend to zero. This also improves on the prior art gain circuit 26 shown in FIG. 2, where the lower limit of the output signal voltage at node NN3 is affected by the voltage across the transistor M8 and the transistor M6 (i.e. the cascaded common gate amplifier). In order to maintain transistors M6 and M8 operating in the normal operation region instead of the triode region, the voltage across transistors M6 and M8 cannot be too small. Therefore, the output signal voltage of the prior art gain circuit 26 on node NN3 is unable effectively tend to zero voltage.

Therefore, because the first and second differential pair of the present invention gain circuit 50 are connected to the first and second driving circuit in cascade manner, the upper and lower limits of the output signal voltage of the present invention gain circuit on node N2 can effectively extend to the direct current voltage VDD and zero voltage.

The present invention gain circuit can extend the input and output signal voltage range. Additionally, the present invention gain circuit uses a p-type MOS transistor to match an n-type MOS transistor, and uses current mirrors to balance biasing. Please observe the locations of the transistors in the present invention gain circuit 50 shown in FIG. 3. The distribution of the biasing current of the two n-type transistors S1 and S2 inside the first differential pair 54 are decided by the p-type transistor S3 and S4 of the first current mirror. The distribution of the biasing current of the two p-type transistors S7 and S8 (which are treated as common source amplifying circuits) inside the first driving circuit 56 are decided by the n-type transistors S9 and S10 of the second current mirror. Similarly, the distribution of the biasing current of the two p-type transistors Q1 and Q2 (which form the differential pair) inside the second differential pair 64 are decided by the n-type transistors Q3 and Q4 of the third current mirror. The p-type transistors Q9 and Q10 of the fourth current mirror decide the distribution of the biasing current of the two n-type transistors Q8 and Q7 (which are treated as common source amplifying circuit) inside the second driving circuit 66.

Using a p-type MOS transistor combined with an n-type MOS transistor and using a current mirror to balance the biasing current can make the present invention gain circuit 50 relatively tolerant to semiconductor production errors. For example, an error produced in the mixing process will make the performance of all the n-type transistors in the gain circuit 50 diverge from the original design value. However, all the p-type transistors, which using an n-type transistor current mirror to decide the biasing current, still can bias equilibrium because of the equilibrium characteristic of the current mirror and each n-type transistor only combining with one p-type transistor. Therefore, the function of the present invention gain circuit 50 will not be affected.

In the prior art gain circuit, the output signal voltage range has been limited so that the output signal voltage is unable to effective tend to zero voltage or VDD. When the prior art gain circuit is treated as a unit-gain buffer circuit, the limitations of the output signal voltage range make the relationship between the input and output signal voltages non-linear. In contrast to the prior art, the input or output signal voltage range of the present invention gain circuit has been effectively extended. When the present invention gain circuit is treated as a unit-gain buffer circuit, even when the input signal voltage is extreme small (near zero voltage) or extreme large (near VDD), the output signal voltage can still follow the input signal voltage, effectively improving the non-linear phenomenon in the prior art. In the prior art gain circuit, when the input signal voltage less than 0.3 volts (near zero voltage), the difference between the input and output signal voltages is higher than one hundred microvolts. However, if the same input signal is inputted into the present invention gain circuit 50, the difference between the input and output signal voltages is only more than ten microvolts or several microvolts. The present invention can effectively make the output signal voltage follow the input signal voltage. Similarly, when the input signal voltage of the prior art gain circuit is greater than VDD-0.3 volts (near the direct current voltage VDD), the difference between the output signal voltage and the input signal voltage is higher than one hundred microvolts, making it unable to achieve the function of being an unit-gain buffer circuit. However, if the same input signal is inputted into the present invention gain circuit 50, the difference between the input and output signal voltages is only more than ten microvolts or several microvolts. The present invention can effectively make the output signal voltage again follow the input signal voltage even though in this extreme situation. Therefore, the present invention gain circuit can improve on a major drawback of the prior art gain circuit and further promote the function of the present invention amplifier.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An amplifier comprising:
   a push-up circuit comprising:
      a first differential pair; and
      a first driving circuit connected to the first differential pair in a cascade manner, the first driving circuit having a common source amplifying circuit formed of a MOS (metal-oxide-semiconductor); and
   a pull-down circuit comprising:
      a second differential pair; and
      a second driving circuit connected to the second differential pair in a cascade manner, the second driving circuit having a common source amplifying circuit formed of a MOS;
         wherein a portion of a normal operation voltage range of the push-up circuit overlaps a portion of a normal operation voltage range of the pull-down circuit, a remaining portion of the normal operation voltage range of the push-up circuit falls outside the normal operation voltage range of the pull-down circuit, a remaining portion of the normal operation voltage range of the pull-down circuit falls outside the normal operation voltage range of the push-up circuit.

2. The amplifier of claim 1 wherein the push-up circuit further comprises a first feedback circuit electrically connected between the first differential pair and the first driving circuit, the pull-down circuit further comprising a second feedback circuit electrically connected between the second differential pair and the second driving circuit.

3. The amplifier of claim 2 wherein the first feedback circuit and the second feedback circuit are used to implement a unit-gain buffer circuit.

4. The amplifier of claim 1 wherein the first differential pair, the first driving circuit, the second differential pair and the second driving circuit comprise a first current mirror, a second current mirror, a third current mirror and a fourth current mirror respectively for biasing and being an active load.

5. The amplifier of claim 1 being operated under a positive DC (direct current) bias.

6. An amplifier comprising:
   a push-up circuit comprising:
      a first differential pair;
      a first driving circuit connected to the first differential pair in a cascade manner, the first driving circuit having a common source amplifying circuit formed of a MOS (metal-oxide-semiconductor); and
      a first feedback circuit electrically connected between the first differential pair and the first driving circuit; and
   a pull-down circuit comprising:
      a second differential pair;
      a second driving circuit connected to the second differential pair in a cascade manner, the second driving circuit having a common source amplifying circuit formed of a MOS; and
      a second feedback circuit electrically connected between the second differential pair and the second driving circuit;
         wherein a portion of a normal operation voltage range of the push-up circuit overlaps a portion of a normal operation voltage range of the pull-down circuit, a remaining portion of the normal operation voltage range of the push-up circuit falls outside the normal operation voltage range of the pull-down circuit, a remaining portion of the normal operation voltage range of the pull-down circuit falls outside the normal operation voltage range of the push-up circuit.

7. The amplifier of claim 6 wherein the first feedback circuit and the second feedback circuit are used to implement a unit-gain buffer circuit.

8. The amplifier of claim 7 wherein the first differential pair, the first driving circuit, the second differential pair and the second driving circuit comprise a first current mirror, a second current mirror, a third current mirror and a fourth current mirror respectively for biasing and being an active load.

9. The amplifier of claim 8 being operated under a positive DC (direct current) bias.

* * * * *